United States Patent
Lee

(10) Patent No.: US 7,033,732 B2
(45) Date of Patent: Apr. 25, 2006

(54) METHOD OF PREPARING ANTI-REFLECTIVE COATING POLYMER AND ANTI-REFLECTING COATING COMPOSITION COMPRISING AN ANTI-REFLECTING COATING POLYMER

(75) Inventor: Geun Su Lee, Yongin-si (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 10/903,076

(22) Filed: Jul. 30, 2004

(65) Prior Publication Data
US 2005/0026076 A1   Feb. 3, 2005

(30) Foreign Application Priority Data
Jul. 31, 2003   (KR) ..................... 10-2003-0053097

(51) Int. Cl.
*G03C 1/76*   (2006.01)
*C08G 79/02*   (2006.01)

(52) U.S. Cl. ................. 430/273.1; 430/271.1; 430/325; 528/287; 528/398

(58) Field of Classification Search ............ 430/271.1, 430/273.1; 528/167, 286, 398, 287
See application file for complete search history.

(56) References Cited

U.S. PATENT DOCUMENTS

| | | | |
|---|---|---|---|
| 5,336,316 A | * | 8/1994 | Dawson et al. ............ 106/724 |
| 5,879,853 A | | 3/1999 | Azuma |
| 6,057,080 A | | 5/2000 | Brunsvold et al. |
| 6,274,295 B1 | | 8/2001 | Dammel et al. |
| 2003/0219682 A1 | | 11/2003 | Wakiya et al. |

OTHER PUBLICATIONS

Chemical Abstract DN 122:272360.*

* cited by examiner

Primary Examiner—Rosemary Ashton
(74) Attorney, Agent, or Firm—Marshall, Gerstein & Borun LLP

(57) ABSTRACT

Disclosed are an organic anti-reflective coating polymer having a structure represented by the following formula I which is introduced to the top portion of photoresist, its preparation method and an anti-reflective coating composition, in a process for forming ultra-fine patterns of photoresist for photolithography by using 193 nm ArF or 157 nm VUV light source. More particularly, the present invention provides an organic anti-reflective coating polymer capable of protecting a photoresist from amine to improve the stability of a post exposure delay and to minimize pattern distortion caused by a swing phenomenon during a patterning process, its preparation method and an anti-reflective coating composition comprising the same. [formula I]

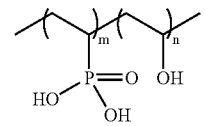

wherein each of m and n is an integer ranging from 5 to 5,000.

15 Claims, 2 Drawing Sheets

METHOD OF PREPARING ANTI-REFLECTIVE COATING POLYMER AND ANTI-REFLECTING COATING COMPOSITION COMPRISING AN ANTI-REFLECTING COATING POLYMER

BACKGROUND OF THE INVENTION

1. Field of the Invention

The present invention relates to a material useful for introducing a coating film onto the top portion of a photoresist, and more particularly to, a top anti-reflective coating polymer which is introduced to the top portion of a photoresist which is introduced to top portion of a photoresist, its preparation method and a top anti-reflective coating composition comprising the same, in a process for forming ultra-fine patterns of photoresist for photolithography by using 193 nm ArF or 157 nm VUV light source.

2. Description of the Related Art

In a fabrication process of ultrafine patterns for preparing semiconductor devices, standing waves and reflective notching inevitably occur due to the optical properties of lower film layer on the photoresist film and due to thickness changes in the photosensitive film. In addition, there is another problem in that a CD (critical dimension) alteration is caused by diffracted and reflected light from the lower film layers. Thus, it has been suggested to introduce anti-reflective coating that prevents back reflection at a lower film layer between a lower film and a photoresist by introducing organic material with high absorbance at a wavelength range of the light employed as a light source.

Especially, when exposed to UV light from a light source, a photoresist thin film is transmitted by the UV light, thus allowing the light absorbed in the bottom portion of the thin film to be scattered and/or reflected. Such anti-reflective coating can absorb the scattered and/or reflected light and, thereby, directly affecting the fine processing of the photoresist.

However, as the patterns are becoming ultra-fine along with the reduction of semiconductor devices to less than 90 nm, it is difficult to completely prevent pattern alteration or distortion generated due to diffused reflection by only the above anti-reflective coating, that is, a bottom anti-reflective coating (hereinafter referred to as BARC) introduced between the bottom film layer and the photoresist. Therefore, it requires an improved anti-reflective coating material to be applied on top portion of the photoresist, which can greatly reduce and/or minimize the pattern distortion caused by the diffused reflection.

In processes for forming ultrafine patterns by using a light source with a wavelength of 157 nm, mostly used is a compound containing fluorine such as a photosensitive agent. Such fluorine based photosensitive compound has a problem that it is contaminated by amine compounds among the atmosphere, since carbon-fluorine bond in the photosensitive compound may form a strong hydrogen bond with a nitrogen-hydrogen bond in the amine compound.

In particular, during the patterning process, a time delay effect for a further process after exposure, a so-called post exposure delay effect, occurs and enlarges the contamination problem concerning the fluorine based photosensitive compound by atmospheric amine compounds such as ammonia. Therefore, a strong demand recently exists for an anti-reflective coating material or patterning process to minimize the contamination of photoresist film due to the post exposure delay.

Accordingly, due to such problems in the conventional art, there is a continuous demand for an additional anti-reflective coating material which can minimize contamination of the photoresist film caused by the amine compound even when it generates the post exposure delay after the exposure while having no adverse effect on the formation of patterns by exposure and development processes, in addition to, which can further reduce alteration or distortion of the pattern caused by the diffused reflection as the anti-reflective coating material is applied together with the conventional anti-reflective coating typically introduced on to the bottom portion of the photoresist, and a method for forming a pattern by employing such anti-reflective coating material.

SUMMARY OF THE INVENTION

The present invention is designed in consideration of the problems of prior art mentioned above, and therefore it is an object of the present invention to provide a top organic anti-reflective coating composition which is introduced to the top portion of a photoresist, in a process for forming ultra-fine patterns of photoresist for photolithography, which can protect a photoresist from amine compounds while having no adverse effect on the patterning process to minimize a post exposure delay effect, and minimize a pattern distortion caused by diffused reflection, and its preparation method.

In another aspect, it is another object of the present invention to provide a top organic anti-reflective coating composition comprising the organic anti-reflective coating polymer mentioned above, a patterning method using the same and a semiconductor device produced by the patterning method.

To achieve the above objects, the present invention provides an organic anti-reflective coating polymer represented by the following general formula I;

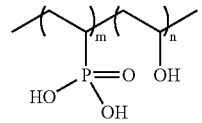

wherein each of m and n is an integer ranging from 5 to 5,000.

The anti-reflective coating polymer of the present invention has a lower absorbance with respect to a light source having a wavelength of 193 nm or 157 nm and can transmit most light for forming the pattern during the exposure process for the photoresist. Further, since the present polymer is a water soluble material having hydrophilic groups in its molecules, easily dissolved in a developing solution but not miscible with a photosensitive agent, and substantially has no effect to the patterning process, thereby it is preferably useable as the anti-reflective coating material to be introduced onto the top portion of the photoresist.

Also, because the present polymer contains phosphoric acid inside itself and can neutralize the amine, it can minimize the effect of the post exposure delay and have an optimized refractive index effective to minimize the diffused reflection from the bottom film layer. As a result, the anti-reflective polymer coating material of the present invention as employed together with the conventional anti-reflective coating can significantly reduce distortion of the pattern generated by the diffused reflection.

As mentioned above, the organic anti-reflective coating polymer according to the present invention has an average molecular weight of 1,000 to 1,000,000, preferably 2,000 to 10,000. Such a range of molecular weight is defined in consideration of physical properties such as the solubility of the anti-reflective coating in water or other developing solutions and/or the absorbance thereof. If such a molecular weight is excessively high, the solubility of the polymer in water may decrease, thereby causing difficulty in producing the anti-reflective coating composition and the coating itself or in dissolving the polymer in the developing solution due to the reduced solubility of the polymer in the developing solution to result in trouble with respect to the patterning process and further processes. When the molecular weight decreases excessively, it may cause a problem in that the anti-reflective coating is not successfully formed due to poor production of cross-linkage bonds within the anti-reflective coating.

Poly (vinylphosphonic acid) polymer having a structure represented by the above formula I is prepared by dissolving a vinylphosphonic acid having a structure represented by the following formula II in an organic solvent, adding a polymerization initiator to the dissolved material, then, conducting free-radical polymerization under a vacuum condition, at 60 to 70° C. for 2 to 6 hours. In Such a reaction process, acetate groups in the vinyl acetate are typically substituted with alcohol groups.

Such polymerization method is one conventional process for preparing organic anti-reflective polymers and, the coating polymer of the present invention can be easily prepared by carrying out the free-radical polymerization of existing and well-known monomers according to the following reaction scheme 1.

[reaction scheme 1]

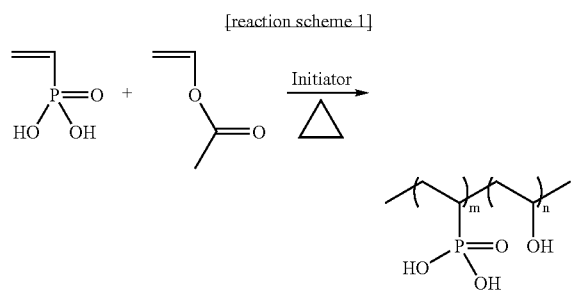

In the method for producing the above polymer according to the present invention, a molecular weight of the finally produced polymer can be varied dependent on the amount of the organic solvent and the reaction time and, the above polymer with the molecular weight suitable to be applied as the anti-reflective coating polymer can be produced by continuously conducting the reaction for about 2 to 6 hours.

The organic solvent used for polymerization in the present invention includes any solvents useable in free-radical polymerization. Especially, preferably used is at least one selected from a group consisting of tetrahydrofuran, cyclohexanone, dimethyl formamide, dimethyl sulfoxide, dioxane, methylethylketone, PGMEA, ethylacetate, benzene, toluene and xylene.

The polymerization initiator used in the present invention includes all of conventional radical initiators for the free-radical polymerization and, preferably, at least one selected from a group consisting of 2,2'-azobisisobutyronitrile (AIBN), benzoyl peroxide, acetyl peroxide, lauryl peroxide, t-butyl peracetate, t-butyl hydroperoxide and di-t-butyl peroxide.

In another aspect of the present invention, there is provided an organic anti-reflective coating composition comprising a polymer represented by the following formula I;

[formula 1]

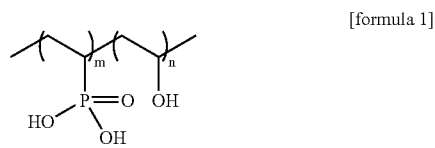

wherein each of m and n is an integer ranging from 5 to 5,000.

The above polymer represented by the formula I has a higher solubility in water and includes hydrophilic functional groups in molecules be immiscible with the photosensitive agent, and have a less absorbance of light at 193 nm or 157 nm wavelength to allow most of the light to be transmitted upon the exposure process, thereby not causing an obstacle to the patterning process or further processes. Accordingly, the anti-reflective coating composition of the present invention may be preferably employed to form the anti-reflective coating on top portion of the photoresist.

In addition to the above, the polymer of the formula I can minimize the effect of the post exposure delay and the diffused reflection from the bottom portion, so that the present invention can favorably form on the top portion of the photoresist the anti-reflective coating polymer which is able to solve and/or noticeably reduce all problems generated by the diffused reflection and/or the post exposure delay without causing a trouble in the patterning process or the like.

The organic anti-reflective coating composition of the present invention may include the polymer represented by formula I in the range of 0.2 to 20% by weight based on the total amount of the composition and, preferably, in the range of 0.5 to 10% by weight. The present coating composition may further comprise deionized water in the range of 80 to 98.8% by weight.

Since the coating composition is typically supplied in the form of aqueous solution, it can be prepared by mixing the polymer with the content defined above and the water, dissolving the polymer in the water and, then, filtering the dissolved solution through a filter having 0.2 μm pore size to produce the final composition as above.

Additionally, in case of introducing the anti-reflective coating on the top portion of the photoresist by using the coating composition of the present invention, this may cause a slight slope or top-loss on top portion of a profile of the pattern along practical process conditions. Optionally, this problem can be solved by adding an amine compound to the coating composition of the present invention. Such amine compound generally includes both aliphatic alkylamines and aliphatic alkylammonium salts.

In a further aspect of the present invention, there is provided a method for forming pattern on a semiconductor device comprising the steps of: (a) coating a photoresist film on a semiconductor substrate formed with a desired bottom structure; (b) applying an organic anti-reflective coating composition on top portion of the photoresist film; and (c) exposing and developing the photoresist film to produce the desired photoresist pattern.

According to the above patterning process of the present invention, it is possible to prevent the contamination of photoresist caused by a post exposure delay and the distortion of a pattern generated by diffused reflection by coating photoresist and then forming an anti-reflective coating on top portion thereof using the organic anti-reflective coating composition of the present invention. Such anti-reflective coating has a higher solubility and is sufficiently dissolved in the developing solution, thereby having no adverse effect on the patterning process.

With respect to the patterning process of the present invention, the process may further include an additional baking process before or after the exposure process, which is preferably conducted at 70 to 200° C.

Although the anti-reflective coating composition and the patterning process according to the present invention are mostly adapted to ultrafine pattern formation processes using ArF light source with 193 nm or VUV light source with 157 nm, they can be also applied to other ultrafine pattern formation processes using KrF (248 nm), EUV (13 nm), E-beam, X-ray or ionic beam. The exposure process using such light sources is preferably performed with specified exposing energy in the range of 0.1 to 50 mJ/cm$^2$.

In the patterning process of the present invention, the development process call be carried out by employing an alkali developing solution. As such an alkali developing solution, preferably provided is 0.01 to 5% by weight tetramethyl ammonium hydroxide (abbreviated to TMAH) in water.

In a still aspect of the present invention, there is provided a semiconductor device produced by the patterning process according to the present invention mentioned above.

BRIEF DESCRIPTION OF THE DRAWINGS

Other objects and aspects of the present invention will become apparent from the following description of examples with reference to the accompanying drawings in which.

DESCRIPTION OF THE PREFERRED EMBODIMENT

EXAMPLES

The present invention is now described in a further detail with reference to following examples, which are only illustrative and are not intended to limit the scope of the invention in any way.

Example 1

Preparation of Top Anti-reflective Coating Polymer 1.3 g of vinylphosphonic acid, 8.7 g of vinyl acetate and 0.1 g of AIBN were dissolved in 30 ml of tetrahydrofuran. The dissolved mixture was reacted at 65 to 70° C. for 5 hours. After completing the reaction, the obtained solution was naturally cooled to precipitate a polymer then the precipitated polymer was filtered and dried to produce the organic anti-reflective coating polymer represented by the formula I in an amount of 5.4 g (89%). Observation of the resulting polymer revealed that it has a weight average molecular weight of 5,520.

Example 2

Preparation of Top Anti-reflective Coating Composition 2 g of the polymer prepared from Example 1 was dissolved in 100 ml of deionized water. The dissolved mixture passed through a filter having a 0.2 μm pore size to produce the desired top organic anti-reflective coating composition.

Example 3

Formation of Photoresist Pattern

On a silicone wafer previously treated with hexamethyl disilazane (HMDS), formed was a film to be etched. To top portion of the film, DHA-160 (manufactured by Dong-Jin SemiChem Co.) as one of the hybrid type photosensitive agents was spin-coated to prepare a photoresist thin film having a thickness of 2,000 Å. Then, the obtained photoresist thin film was put under a soft baking process in an oven at 130° C. for 90 seconds. Thereafter, by spin-coating the top organic anti-reflective coating composition prepared in Example 2 at 3,000 rpm, the anti-reflective coating, that is, the top ARC having a thickness of 300 Å was coated on the top portion of the photoresist. After conducting the soft-baking process, an exposure process was carried out by an exposure apparatus having a 0.63 NA ArF laser and then a further post-baking process was carried out in the oven at 130° C. for 90 seconds. After completion of the baking process, the baked product was immersed in aqueous solution of 2.38% by weight of tetramethyl ammonium hydroxide for 30 seconds to be developed. The developed material was washed by spraying deionized water and dried to obtain an ultra-fine photoresist pattern with 90 nm L/S.

Figure 1:
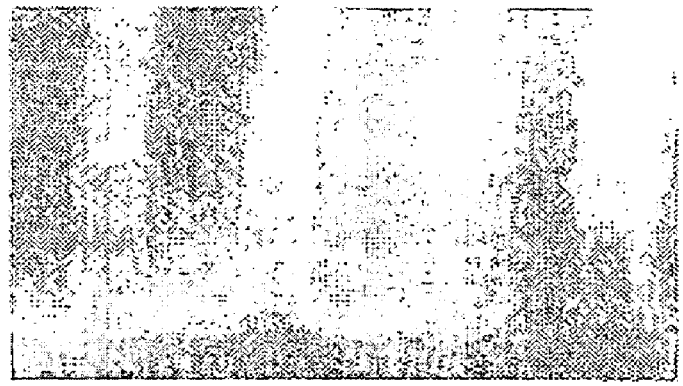
FIG. 1 is a scanning electron microscopic (SEM) photograph illustrating a pattern formed by introducing the anti-reflective coating composition prepared in Example 3 according to the present invention onto top portion of a photoresist.

The photoresist pattern formed by the above method was illustrated in FIG. 1.

Example 4

Evaluation of the Effect by the Post Exposure Delay

Figure 2:
FIG. 2 is an electron microscopic photograph illustrating a pattern formed by introducing the anti-reflective coating composition prepared in Example 4 according to the present invention onto top portion of the photoresist.
Figure 3:
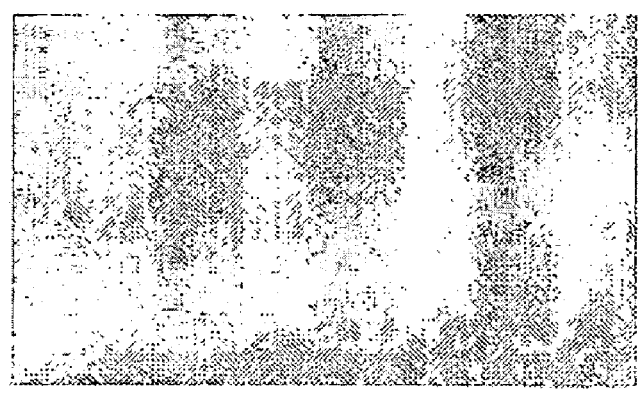
FIG. 3 is an electron microscopic photograph illustrating a pattern formed by introducing the anti-reflective coating composition prepared in Example 4 according to the present invention onto the top portion of the photoresist after 5 minutes after exposure.
Figure 4:
FIG. 4 is an electron microscopic photograph illustrating a pattern formed by introducing the anti-reflective coating composition prepared in Example 4 according to the present invention on top portion of the photoresist after 30 minutes after exposure.

With respect to the photoresist pattern formed by a procedure described in Example 3, the effect of the post exposure delay was determined by observing variations in shape of the pattern depending on the time passed. The resultant pattern immediately after the exposure was shown in FIG. 2, and both of the patterns of 5 minutes and 30 minutes after the exposure were illustrated in FIGS. 3 and 4, respectively.

In addition to the above, CDs of such patterns were listed in the following Table 1.

TABLE 1

| Extended time | immediately after exposure (FIG. 2) | 5 minutes after exposure (FIG. 3) | 30 minutes after exposure (FIG. 4) |
| --- | --- | --- | --- |
| CD | 91 nm | 90 nm | 91 nm |

As illustrated in the above Table 1 and accompanying Figures, it can be seen that variation of CD was within an allowable error range and the shape of the pattern was maintained as it is even when the effect of the post exposure delay was generated. In addition, when using a top anti-reflective coating composition to form ultra-fine patterns, the effect of the post exposure delay can be minimized.

Comparative Example 1

Formation of Photoresist Pattern According to Conventional Art

On a silicone wafer previously treated with hexamethyl disilazane (HMDS), formed was a film to be etched. To top portion of the film, DHA-160 (manufactured by Dong-Jin SemiChem Co.) as one of hybrid type photosensitive agents was spin-coated to prepare a photoresist thin film having a thickness of 2,000 Å. Then, the obtained photoresist thin film was put under a soft baking process in an oven at 130° C. for 90 seconds. After the soft-baking process, a time delay process was carried out for 10 minutes on a track having 1 ppb amine density for 5 minutes. Then, the obtained material was immersed in an aqueous solution of 2.38% by weight of tetramethyl ammonium hydroxide for 30 seconds to be developed. The developed material was washed by spraying deionized water and dried to obtain a photoresist pattern with 90 nm L/S T-top form.

Figure 5:
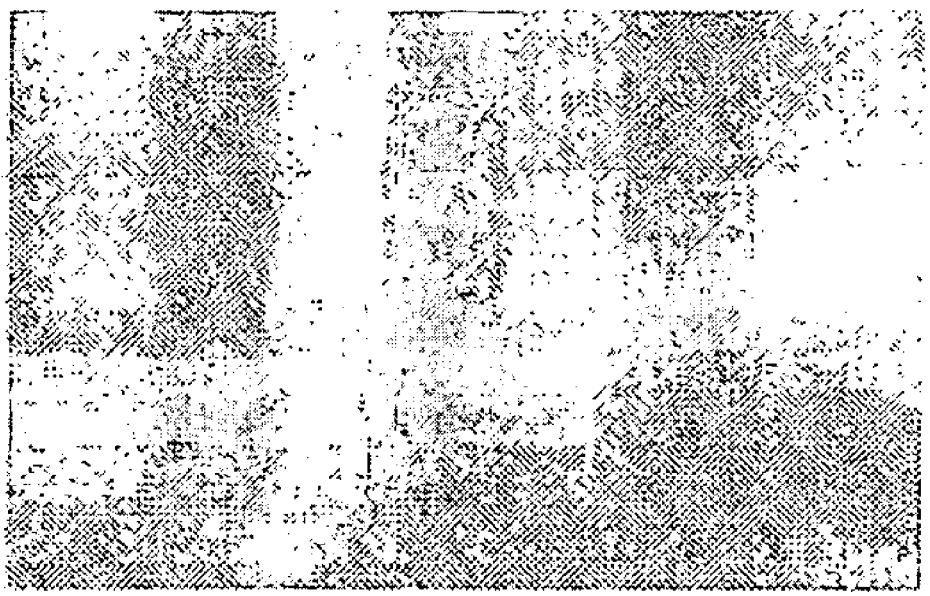
FIG. 5 is an electron microscopic photograph illustrating a pattern formed by introducing an anti-reflective coating composition prepared in Comparative Example 1 according to the present invention onto the top portion of the photoresist.

The photoresist pattern formed by the above method was illustrated in FIG. 5. As shown in FIG. 5, distortion of pattern caused by the diffused reflection was observed under 1 ppb amine density condition when the ultra-fine pattern was formed without using the anti-reflective coating composition of the present invention.

As above mentioned, according to the present invention, it is possible to minimize the effect of the post exposure delay and extremely reduce distortion phenomenon of the pattern caused by the diffused reflection while not causing an impediment to the patterning process or further processes by introducing the organic anti-reflective coating on top portion of the photoresist.

Especially, by applying the anti-reflective coating according to the present invention together with conventional anti-reflective coating introduced to the bottom portion of the photoresist, it is possible to minimize the diffused reflection, in turn, damage of the patterns, whereby the present invention can remarkably contribute to the stability of a photolithography process at less than 90 nm.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for preparing a top anti-reflective coating polymer comprising the steps of:
    dissolving vinylphosphonic acid and vinyl acetate in organic solvent;
    adding a polymerization initiator to the dissolved solution; and
    conducting free-radical polymerization represented by the following reaction scheme 1.

[reaction scheme 1]

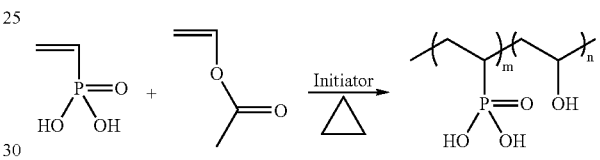

wherein each of each of m and n is an integer ranging from 5 to 5,000.

2. The method according to claim 1, wherein the organic solvent comprises at least one selected from a group consisting of tetrahydrofuran, cyclohexanone, dimethyl formamide, dimethyl sulfoxide, dioxane, methylethylketone, PGMEA, ethylacetate, benzene, toluene and xylene.

3. The method according to claim 1, wherein the polymerization initiator comprises any one selected from a group consisting of 2,2'-azobis isobutyronitrile (AIBN), benzoyl peroxide, acetyl peroxide, lauryl peroxide, t-butyl peracetate, t-butyl hydroperoxide and di-t-butyl peroxide.

4. The method according to claim 2, wherein the polymerization initiator comprises any one selected from a group consisting of 2,2'-azobis isobutyronitrile (AIBN), benzoyl peroxide, acetyl peroxide, lauryl peroxide, t-butyl peracetate, t-butyl hydroperoxide and di-t-butyl peroxide.

5. The method according to claim 1, wherein the polymerization is carried out at 60 to 70° C. for 2 to 6 hours.

6. A top anti-reflective coating composition comprising a polymer represented by the following formula I

[formula I]

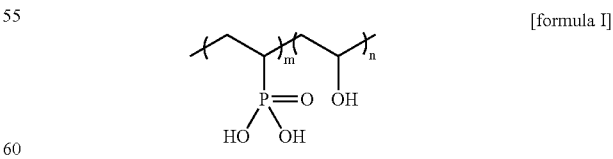

wherein each of m and n is an integer ranging from 5 to 5,000.

7. The composition according to claim 6, wherein the polymer represented by the above formula I is contained in an amount of 1 to 20% by weight based on the total amount of the composition.

8. The composition according to claim 6, wherein the composition further comprises an amine compound.

9. The composition according to claim 8, wherein the amine compound is aliphatic alkyl amines or aliphatic alkyl ammonium salts.

10. A method for forming pattern on a semiconductor device comprising the steps of:
   (a) coating a photoresist pattern film on a semiconductor substrate formed with a desired bottom structure;
   (b) applying the top anti-reflective coating composition according to claim 7 on top portion of the photoresist film;
   (c) exposing the photoresist film; and
   (d) developing the exposed photoresist film to produce the desired photoresist pattern.

11. The method according to claim 10, further comprising an additional baking process before or after the exposure.

12. The method according to claim 10, wherein the developing process is carried out by using an aqueous solution of 0.01 to 5% by weight tetramethyl ammonium hydroxide (TMAH) as a developing solution.

13. The method according to claim 11, wherein the developing process is carried out by using an aqueous solution of 0.01 to 5% by weight tetramethyl ammonium hydroxide (TMAH) as a developing solution.

14. The method according to claim 10, wherein the exposure process is carried out by using a light source selected from a group consisting of KrF, ArF, VUV, EUV, E-beam, X-ray and ionic beam.

15. A semiconductor device produced by the pattern formation method of claim 10.

* * * * *